US005973959A

United States Patent [19]

Gerna et al.

[11] Patent Number: 5,973,959

[45] Date of Patent: Oct. 26, 1999

[54] CIRCUIT AND METHOD OF READING CELLS OF AN ANALOG MEMORY ARRAY, IN PARTICULAR OF THE FLASH TYPE

[75] Inventors: Danilo Gerna, Montagna In Valtellina; Roberto Canegallo, Tortona; Ernestina Chioffi, Pavia; Marco Pasotti, S. Martino Siccomario; Pier Luigi Rolandi, Monleale, all of Italy

[73] Assignee: STMicroelectronics S.r.l., Agrate Brianza, Italy

[21] Appl. No.: 09/121,024

[22] Filed: Jul. 22, 1998

[51] Int. Cl.[6] ............................ G11C 16/04; G11C 16/06

[52] U.S. Cl. ................................ 365/185.03; 365/185.19; 365/185.2; 365/185.21; 365/185.33

[58] Field of Search ......................... 365/185.03, 185.19, 365/185.2, 185.21, 185.33

[56] References Cited

U.S. PATENT DOCUMENTS

| | | | |
|---|---|---|---|
| 5,091,888 | 2/1992 | Akaogi | 365/185.21 |
| 5,335,198 | 8/1994 | Buskirk et al. | 365/185.21 |
| 5,351,212 | 9/1994 | Hashimoto | 365/185.21 |
| 5,699,295 | 12/1997 | Yero | 365/185.21 |
| 5,712,815 | 1/1998 | Bill et al. | 365/185.03 |
| 5,805,500 | 9/1998 | Campardo et al. | 365/185.21 |
| 5,838,612 | 11/1998 | Calligaro et al. | 365/185.03 |

*Primary Examiner*—Trong Phan
*Attorney, Agent, or Firm*—David V Carlson; Kimton N. Eng.; Seed and Berry LLP

[57] ABSTRACT

A reading circuit comprises a current mirror circuit connected, at a first and a second output node, to the drain terminals of an array cell and of a reference cell; a comparator whose inputs are connected to the output nodes of the current mirror circuit; a ramp generator having an enabling input connected to the output of the comparator and an output connected to the control terminal of the reference cell. Biasing the gate terminal of the array cell to a constant voltage, when the currents flowing in the array cell and in the reference cell are equal, the value assumed by the ramp voltage is proportional to the threshold value of the array cell; at that time the comparator is triggered and discontinues the ramp increase, supplying as output the desired threshold value.

20 Claims, 2 Drawing Sheets

CIRCUIT AND METHOD OF READING CELLS OF AN ANALOG MEMORY ARRAY, IN PARTICULAR OF THE FLASH TYPE

TECHNICAL FIELD

The present invention relates to a circuit and a method of reading cells of an analog memory array, in particular of the flash type.

BACKGROUND OF THE INVENTION

As is known, a memory cell is typically read by biasing the gate terminal of the cell (via a word line to which the gate terminal is connected) to a reading voltage $V_{PCX}$ of predetermined value and by forcing a biasing current $I_f$ into a bit line, to which the drain terminal of the cell to be read is connected. When the selected cell is kept in the linear region, the following equation applies:

$$I_f=K^*(W/L)^*[(V_{PCX}-V_{th})-V_{DS}/2]^*V_{DS} \quad (1)$$

in which K is a constant related to the manufacturing process, W/L is the width/length dimensional relationship of the cell, $V_{th}$ is the threshold voltage of the cell (i.e., the minimum voltage to be applied between the gate and source terminals of the cell to start to conduct current) and $V_{DS}$ is the drain-source voltage across the cell.

When the cell is appropriately biased, the voltage $V_{DS}$ is constant and the term $V_{DS}/2$ is negligible with respect to the term ($V_{PCX}-V_{th}$). Consequently, the current $I_f$ flowing through the cell is linearly dependent on the threshold voltage $V_{th}$ and (1) becomes:

$$I_f=K^*(W/L)^*(V_{PCX}-V_{th})^*V_{DS} \quad (2)$$

Various circuits for reading the threshold voltage $V_{th}$ have been proposed. However, these circuits are not precise or rapid enough because the threshold value and the electrical characteristics of the cells are strongly dependent on temperature and because the cell has a low transconductance and high parasitic capacitances.

SUMMARY OF THE INVENTION

According to principles of the invention, a circuit and method is provided for reading a memory cell of an analog memory array, in particular of the flash type, that will resolve the drawbacks of current solutions.

An embodiment of the invention is based on generating an external ramp voltage that is supplied to the gate terminal of a reference (for instance blank) flash cell not belonging to the memory array. When a constant reading voltage is applied to the cell to be read the resulting fixed current is compared with the increasing current of the reference cell. When the two currents are equal, the external ramp voltage is discontinued. As a result, the instantaneous voltage value is proportional to the threshold voltage of the cell to be read.

A number of preferred embodiments of the present invention, given purely by way of non-limiting example, arc set out in the following description and made with reference to the accompanying drawings.

DETAILED DESCRIPTION OF THE INVENTION

Figure 1:
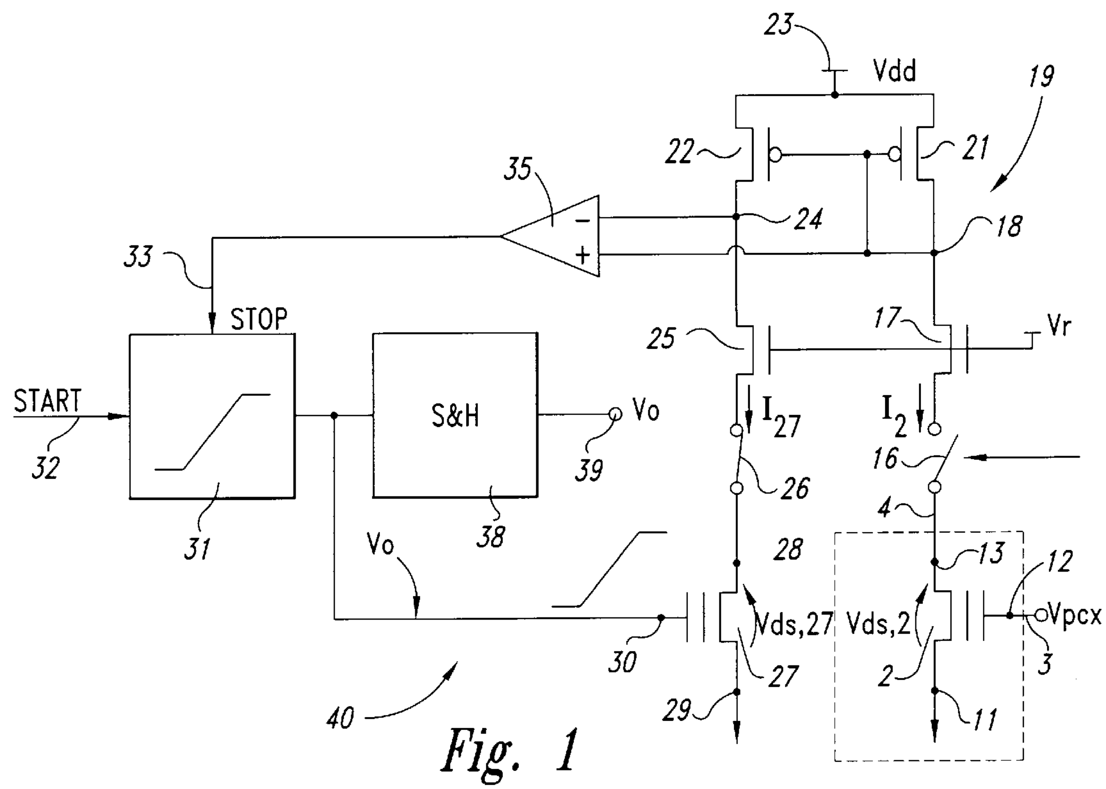
FIG. 1 shows a simplified circuit diagram of a first embodiment of the present reading circuit.

In FIG. 1, a cell 2 to be read belongs to a flash memory array 1, comprising a plurality of cells disposed in rows and columns and biased using word lines 3 and bit lines 4 shown only diagrammatically.

The cell 2 to be read has a source terminal 11 connected to ground, a gate terminal 12 connected to word line 3 which may be biased to the reading voltage $V_{PCX}$, and a drain terminal 13 connected to bit line 4. Bit line 4 is in turn connected to a node 18 via a selector switch 16 and a first NMOS biasing transistor 17 belonging to a column decoder (not shown). Node 18 is connected to a current mirror circuit 19 formed by two PMOS transistors 21 and 22. PMOS transistor 21 is diode-connected (i.e., has its drain and gate terminals short-circuited) and has its drain terminal connected to node 18, its source terminal connected to supply line 23 set to $V_{dd}$, and its gate terminal connected to the gate terminal of PMOS transistor 22. PMOS transistor 21 has its source terminal connected to supply line 23 and its drain terminal connected to a node 24.

Node 24 is connected through a second NMOS biasing transistor 25 and a dummy switch 26, which is always kept closed, to the drain terminal 28 of a reference cell 27. The reference cell 27 may be a blank cell not belonging to memory array 1 and has a source terminal 29 connected to ground and a gate terminal 30 connected to the output of a ramp generator 31. Ramp generator 31 has an enabling input 32 receiving a START signal and a disabling input 33 receiving a STOP signal. Disabling input 33 is connected to the output of a comparator 35 having a non-inverting input connected to node 18 and an inverting input connected to node 24. The output of ramp generator 31 is also connected to a sample-and-hold circuit 38 whose output 39 forms the output of reading circuit 40.

FIG. 1 also shows some physical quantities useful for the following discussion. In particular, shown in FIG. 1 are: output voltage $V_o$ of ramp generator 31; drain-source voltages $V_{DS,2}$ across cell 2 to be read and $V_{DS,27}$ across reference cell 27; and currents $I_2$ and $I_{27}$ flowing though their respective cells.

In the circuit of FIG. 1, biasing transistors 17 and 25 maintain cells 2 and 27 in linear region and prevent the cells to be cancelled when they are not selected, by maintaining a constant voltage drop between the drain and source terminals of cells 2 and 27.

Reading circuit 40 of FIG. 1 operates as follows. When it receives the START signal at its input 32, ramp generator 31 starts to generate a voltage whose value increases in a linear manner from a minimum to a maximum value. As long as voltage $V_o$ supplied to reference cell 27 is low, this cell conducts little current and node 24 remains at a voltage greater than node 18. Consequently, the STOP signal is low and ramp generator 31 remains actuated.

As soon as voltage $V_o$ reaches a value such that reference cell 27 is conducting a current $I_{27}$ equal in value to current $I_2$ flowing through cell 2 to be read, the voltage at node 18 reaches the same value as the voltage at node 24. Comparator 35 then is triggered, bringing the STOP signal to a high value and discontinuing the increase of voltage $V_o$. Ignoring any delay between the switching instant of comparator 35 and disabling of ramp generator 31, voltage $V_o$ present at output 39 of reading circuit 40 is proportional to the threshold voltage of cell 2 to be read, as explained below.

Assuming that cell 2 to be read and reference cell 27 are produced by the same technology and have identical threshold values and electrical characteristics, on the basis of (2), currents $I_2$ and $I_{27}$ are given by:

$$I_2=K^*(W/L)^*(V_{PCX}-V_{th,2})^*V_{DS,2} \tag{3}$$

$$I_{27}=K^*(W/L)^*(V_o-V_{th,27})^*V_{DS,27} \tag{4}$$

in which $V_{th,2}$ and $V_{th,27}$ are the threshold voltages of cell 2 to be read and reference cell 27, respectively, and the other quantities have the meaning already explained above.

When comparator 35 switches, the following applies:

$$I_2=I_{27} \tag{5}$$

Moreover, at equilibrium the voltages at nodes 18 and 24 are identical and, given that biasing transistors 17, 25 receive at their gate terminals a same biasing voltage $V_R$(for example of 1.2–1.4 V), they have a same gate-source drop. Therefore, it follows that:

$$V_{DS,2}=V_{DS,27} \tag{6}$$

From (3) and (4), and taking account of (5) and (6), it can be derived that:

$$V_{PCX}-V_{th,2}=V_o-V_{th,27} \tag{7}$$

From (7) it can immediately be obtained that:

$$V_o=V_{PCX}-(V_{th,2}-V_{th,27}) \tag{8}$$

or $$V_{th,2}=V_{PCX}-V_o+V_{th,27} \tag{9}$$

From (9), it can be deduced that threshold voltage $V_{th,2}$ of cell 2 to be read depends in a linear manner on output voltage $V_o$ of reading circuit 40. Thus, as threshold voltage $V_{th,27}$ of reference cell 27 and reading voltage $V_{PCX}$ applied to gate terminal 12 of cell 2 to be read are known it is possible to obtain the value of the desired threshold voltage $V_{th,2}$.

Precise knowledge of the actual threshold voltage $V_{th,27}$ of reference cell 27 is not necessary. For storing and subsequently reading the threshold voltage of cell 2 to be read it is necessary to know only its relative value with respect to the threshold voltage of reference cell 27. Looking at (8), this is the value of output voltage $V_o$ less the reading voltage $V_{PCX}$.

Therefore, output voltage $V_o$ is not dependent on the operating point of the circuit and is also not dependent on temperature. Assuming that threshold voltage is given by the algebraic sum of two terms, a first at constant temperature (300° K.) and a second β(T) depending on temperature (and of decreasing value), the following relationships are valid for cell 2 to be read and for reference cell 27:

$$V_{th,2}=V_{th,2}(300^\circ \text{ K.})+\beta(T) \tag{10}$$

$$V_{th,27}=V_{th,27}(300^\circ \text{ K.})+\beta(T) \tag{11}$$

and (8) becomes:

$$V_o=V_{PCX}-[V_{th,2}(300^\circ \text{ K.})+V_{th,27}(300^\circ \text{ K.})] \tag{12}$$

thus, the output voltage $V_o$ is independent of temperature variations.

For the circuit described above, any noise present in the supply line or in the biasing voltages $V_{PCX}$ or $V_R$ produces identical interference in the currents of cell 2 to be read and reference cell 27, without affecting output voltage $V_o$ which is therefore substantially insensitive to ordinary noise.

Since the switching speed of comparator 35 is limited, reading circuit 40 of FIG. 1 has an offset error due to the delay between switching of comparator 35 and disabling of ramp generator 35. If this offset error is independent of temperature and constant over time, it does not result in incorrect circuit reading because it is also present during programming of the cell. However, if this were not the case, it is possible to use a different embodiment of the circuit of FIG. 1, as shown in FIG. 2.

Figure 2:
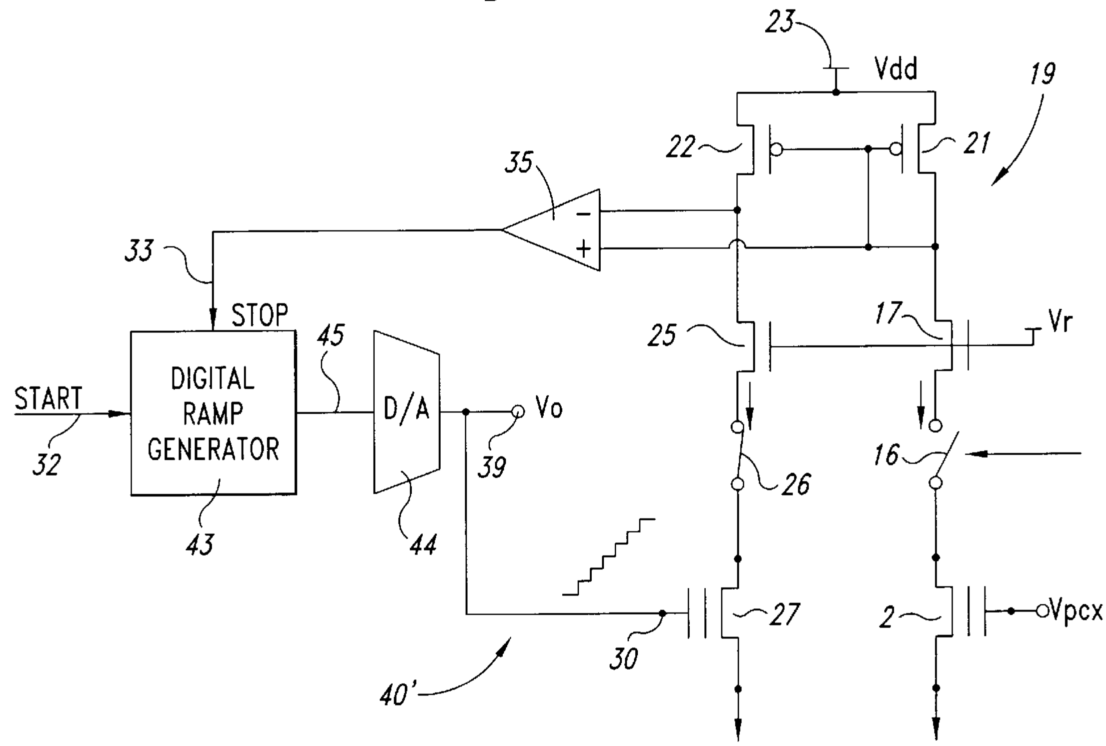
FIG. 2 shows a simplified circuit diagram of a second embodiment of the present circuit.

The reading circuit 40' of FIG. 2 differs from that of FIG. 1 only in that it generates a discrete, rather than continuous, voltage ramp. Therefore, ramp generator 31 and sample-and-hold circuit 38 of FIG. 1 are replaced by a digital ramp generator 43 and by a digital/analog converter 44, as shown in FIG. 2. The digital generator 43 has an enabling input 32 and a disabling input 33 as in FIG. 1. Output 45 of digital generator 43 is connected to an input of D/A converter 44, whose output 39 is connected to gate terminal 30 of reference cell 27 and forms the output of circuit 40'.

With the circuit shown in FIG. 2, any delay of comparator 35 does not entail a reading error because the output voltage $V_o$ of digital ramp generator 43 increases in a discrete and incremental manner. By suitably designing the circuit, it is possible for the output voltage to increase by one step only after comparator 35 has had time to react to the preceding voltage step.

Figure 3:
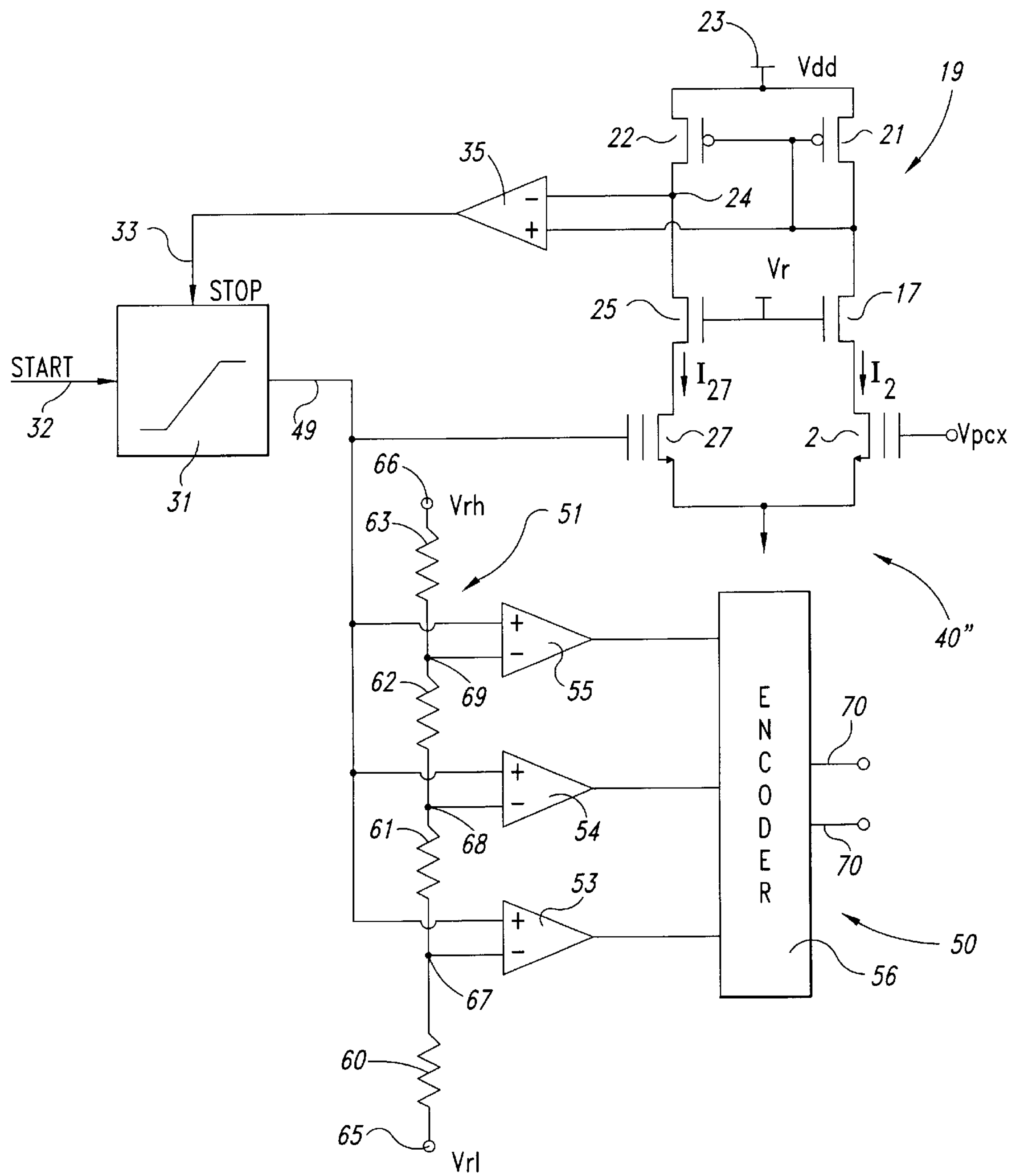
FIG. 3 shows a simplified circuit diagram of a third embodiment of the present circuit.

FIG. 3 shows a third embodiment that can be advantageously used for digital applications. In the embodiment shown, a two-bit digital signal correlating to the value of the desired threshold level is output. Circuit 40" of FIG. 3 comprises an analog ramp generator 31, as in the embodiment of FIG. 1, but its output 49 is supplied to an analog/digital converter 50 formed by a voltage divider 51, comparators 53, 54, and 55, and an encoder 56, rather than to a sample-and-hold circuit. Voltage divider 51 comprises four resistors 60, 61, 62, and 63 connected reciprocally in series between nodes 65 and 66. Voltage $V_{RL}$ at node 65 will be equal to a minimum value that can be assumed by voltage $V_o$; for example, in the case of maximum threshold difference between cells 2 and 27, $V_o$ will be equal to 0 V. Voltage $V_{RH}$ at node 66 will be equal to a maximum voltage that can be assumed by voltage $V_o$; for example, in case of a zero threshold difference between cells 2 and 27, $V_o$ will be equal to $V_{PCX}$. Consequently, voltages of intermediate value between $V_{RL}$ and $V_{RH}$ are present at intermediate nodes 67–69 between resistors 60–63. Comparators 53, 54 and 55 have their positive input connected to output 49 of ramp generator 31 and their negative input connected to a respective intermediate node 67, 68 and 69. The outputs of comparators 53–55 are supplied to encoder 56 having an output 70 to which the two-bit digital encoding of voltage $V_o$ is supplied.

In circuit 40" of FIG. 3, as output voltage $V_o$ of ramp generator 31 increases and exceeds the voltage present at intermediate nodes 67, 68 and 69, comparators 53, 54, and 55 switch from low to high state, successively. As in the case of circuits 40 and 40', when the currents $I_2$ and $I_{27}$ are equal comparator 35 switches. Encoder 56 will then output a two-bit digital signal correlating to the number of comparators 53, 54, and 55 which have positive output, and consequently, correlating to the value of the threshold difference existing between cells 2 and 27.

The circuit shown in FIG. 3 is particularly suitable for digital uses, in which the accuracy of the reading level depends on the number of comparators used and therefore on the number of bits of the output signal. Reading circuit 40" is simple and reliable because it requires only a reference value and its output can be directly used in digital devices.

It is evident that the embodiments of the reading circuits described and illustrated above can be modified and varied without departing from the scope of the present invention. For example, the ramp voltage may be increasing or decreasing, or may also have a non-linear behavior, provided that it is monotonic.

We claim:

1. A reading circuit of a cell of an analog memory array connected to a first and a second cell each having a first terminal and a control terminal, the reading circuit comprising:

a current mirror circuit having a first and a second node connected to the first terminal of the first and the second cell respectively;

biasing means connected to the control terminal of the first cell;

comparator means having an output, and a first and a second input connected to the first and second node of the current mirror circuit respectively; and a generator stage of a voltage that can be varied in a monotonic manner, the generator stage having an enabling input connected to the output of the comparator means and an output connected to the control terminal of the second cell and to an output of the reading circuit.

2. The reading circuit according to claim 1 wherein the generator stage comprises a ramp generator.

3. The reading circuit according to claim 1 wherein the voltage is increasing.

4. The reading circuit according to claim 1 wherein the first cell is a memory array cell to be read and the second cell is a reference cell.

5. The reading circuit according to claim 1 wherein the comparator means have a positive input connected to the first node, a negative input connected to the second node and the output supplying a disabling signal on detection of identical currents in the first and second cells, in that the generator stage comprises an enabling input and in that said enabling input defines a disabling input receiving the disabling signal from the comparator means.

6. The reading circuit according to claim 1 wherein the first terminal of the first cell is a drain terminal and the control terminal of the first cell is biased to a constant reference voltage.

7. The reading circuit according to claim 1 wherein the generator stage comprises an analog ramp generator element and a sample-and-hold circuit connected to the analog ramp generator element, and having an output defining the output of the reading circuit.

8. The reading circuit according to claim 1 wherein the generator stage comprises a digital ramp generator and a digital/analog converter connected to the digital ramp generator, and having an output defining the output of the reading circuit and connected to the control terminal of the second cell.

9. The reading circuit according to claim 1 wherein the generator stage comprises an analog ramp generator element and an analog/digital converter circuit.

10. The reading circuit according to claim 9 wherein the analog/digital converter circuit comprises a plurality of comparator elements each having an output, a first input connected to the analog ramp generator element, and a second input connected to a respective reference voltage, and an encoder having a plurality of inputs connected to the outputs of said comparator elements and an output supplying a digital signal.

11. A memory cell reading circuit for reading data from a memory cell of a memory cell array, the memory cell having a first terminal and a control terminal, the reading circuit comprising:

a reference cell having a first terminal and a control terminal;

a current mirror circuit having an input terminal connected to the first terminal of the memory cell and an output terminal connected to the first terminal of the reference cell;

a comparator circuit having an output terminal, a first input terminal connected to the input terminal of the current mirror circuit, and a second input terminal connected to the output terminal of the current mirror circuit;

a signal generator circuit having an enabling input terminal, a disabling input terminal connected to the output terminal of the comparator circuit, and an output terminal coupled to the control terminal of the reference cell; and an output circuit having an input terminal connected to the output terminal of the signal generator circuit and also having at least one output terminal.

12. The reading circuit according to claim 11 wherein the output circuit comprises a sample-and-hold circuit and the signal generator circuit comprises an analog ramp generator, the analog ramp generator generating a linearly increasing voltage signal.

13. The reading circuit according to claim 11 wherein the signal generator circuit comprises a digital ramp generator and a digital-to-analog converter circuit connected to the digital ramp generator, the digital ramp generator generating a discretely increasing voltage signal.

14. The reading circuit according to claim 11 wherein the output circuit comprises:

a first voltage reference and a second voltage reference;

a voltage divider circuit coupled between the first and second voltage references, the voltage divider circuit having a plurality of voltage reference nodes;

a plurality of comparator circuits, each comparator circuit having an output terminal, a first input terminal connected to the output terminal of the signal generator circuit, and a second input terminal connected to a respective voltage reference node; and an encoder circuit having at least one output terminal and a plurality of input terminals, each input terminal connected to a respective output terminal of the plurality of comparator circuits.

15. A method of reading cells of an analog memory array, in particular of the flash type, comprising the steps of:

connecting a first and a second cell to a current mirror circuit;

biasing the control terminal of the first cell to a predetermined constant voltage; and comparing first and second currents flowing in said first and second cells, respectively;

wherein the step of comparing the currents comprises the steps of:

supplying a voltage variable in a monotonic manner to the control terminal of the second cell as long as said first and second currents differ; and determining a threshold voltage of the first cell with respect to the second cell on the basis of an instantaneous value assumed by the variable voltage when the first and second currents become identical.

16. The method of reading cells according to claim 15 wherein the variable voltage is a linearly variable voltage.

17. The method of reading cells according to claim 15 wherein the variable voltage is an increasing voltage.

18. The method of reading cells according to claim 15 wherein the variable voltage is an analog voltage and the method further comprises the steps of:

sampling said analog voltage; and storing said analog voltage.

19. The method of reading cells according to claim 15 wherein the variable voltage defines a discrete ramp.

20. The method of reading cells according to claim 15 wherein the step of determining the threshold voltage comprises the step of calculating the difference between a predetermined constant voltage and the instantaneous value.

* * * * *

UNITED STATES PATENT AND TRADEMARK OFFICE
CERTIFICATE OF CORRECTION

PATENT NO. : 5,973,959
DATED : October 26, 1999
INVENTOR(S) : Danilo Gerna et al.

It is certified that error appears in the above-indentified patent and that said Letters Patent is hereby corrected as shown below:

On the front cover of the issued patent, section [30], the Foreign Application Priority Data should read --July 25, 1997 Italian Patent Office TO997A 000667--.

Signed and Sealed this

Seventeenth Day of April, 2001

Attest:

NICHOLAS P. GODICI

*Attesting Officer* *Acting Director of the United States Patent and Trademark Office*

UNITED STATES PATENT AND TRADEMARK OFFICE

CERTIFICATE OF CORRECTION

PATENT NO. : 5,973,959
DATED : October 26, 1999
INVENTOR(S) : Danilo Gerna et al.

It is certified that error appears in the above-identified patent and that said Letters Patent is hereby corrected as shown below:

Title page,
Item [30], the Foreign Application Priority Data should read:
-- July 25, 1997 Italian Patent Office T097A 0667

This certificate supersedes Certificate of Correction issued April 17, 2001.

Signed and Sealed this

Twenty-fifth Day of June, 2002

*Attest:*

JAMES E. ROGAN

*Attesting Officer* *Director of the United States Patent and Trademark Office*